United States Patent [19]
Idei

[11] 4,103,248
[45] Jul. 25, 1978

[54] VOLTAGE FOLLOWER CIRCUIT

[75] Inventor: Gijun Idei, Yokohama, Japan

[73] Assignee: Tokyo Shibaura Electric Co., Ltd., Tokyo, Japan

[21] Appl. No.: 713,244

[22] Filed: Aug. 10, 1976

[30] Foreign Application Priority Data

Aug. 12, 1975 [JP] Japan ................................ 50-97982

[51] Int. Cl.² ........................ H03F 3/18; H03F 1/34
[52] U.S. Cl. .................................. 330/288; 330/293; 330/310
[58] Field of Search ................ 330/17, 22, 30 D, 40, 330/28

[56] References Cited

U.S. PATENT DOCUMENTS 3,760,288  9/1973  Leonard .......................... 330/17 X
3,849,735  11/1974  Haenen et al. .................. 330/30 D

FOREIGN PATENT DOCUMENTS 2,223,772  11/1972  Fed. Rep. of Germany ......... 330/17

Primary Examiner—James B. Mullins
Attorney, Agent, or Firm—Finnegan, Henderson, Farabow & Garrett

[57] ABSTRACT

A voltage follower circuit comprises an input terminal; an output terminal; first and second power supply terminals; a first transistor of one conductivity type having a base connected to the input terminal; a second transistor, opposite in conductivity type to the first transistor, having a base connected to the collector of the first transistor, a collector connected to the output terminal and an emitter connected to the first power supply terminal; a third transistor having a base and collector connected to the output terminal and an emitter connected to the emitter of the first transistor; a fourth transistor of the one conductivity type having an emitter connected to the second power supply terminal; and a fifth transistor of the one conductivity type having an emitter and base respectively connected to the emitter and base of the fourth transistor and a collector connected to the base of the fourth transistor and to the first power supply terminal through a resistor.

10 Claims, 7 Drawing Figures

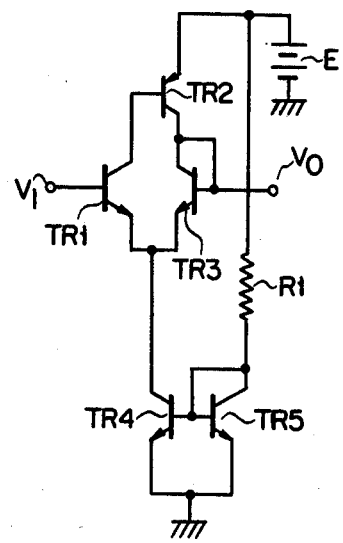
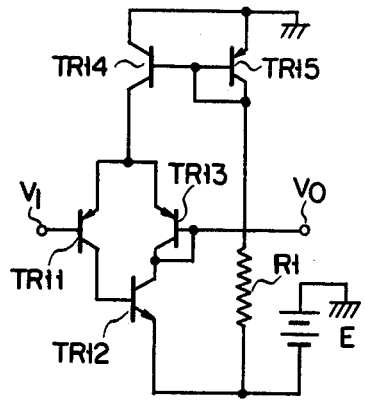
F I G. 1    F I G. 2
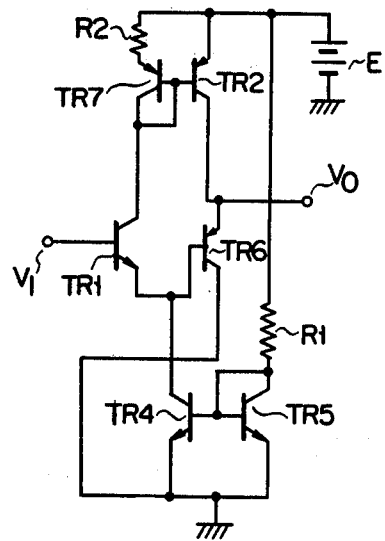
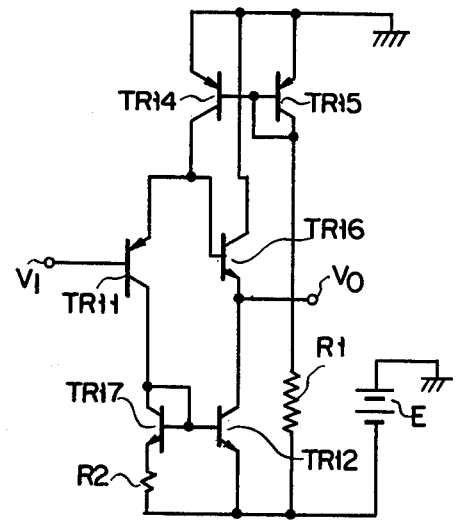
F I G. 3    F I G. 4

VOLTAGE FOLLOWER CIRCUIT

This invention relates to a voltage follower circuit which can maintain a voltage amplification factor substantially constant and effect current amplification with a small input and output voltage difference.

An emitter follower circuit involves a greater input impedance and permits current amplification with voltage amplification of unity. The input and output voltages of the emitter follower circuit have a voltage difference corresponding to a voltage across the base-emitter of the transistor. For an npn transistor, for example, the output voltage becomes lower than the input voltage by an amount corresponding to a voltage across the base-emitter of this transistor. For a pnp transistor, on the other hand, the output voltage becomes higher than the input voltage by an amount corresponding to a voltage across the base-emitter of this transistor. Where a silicon transistor is used as a transistor for the emitter follower circuit, the emitter-base voltage of the transistor is at a high level of about 0.65 volts, providing restricted output voltage and in consequence restricting the application of the emitter follower circuit.

It is accordingly the object of this invention to provide a voltage follower circuit capable of taking out a greater output current with small difference between the input and output voltages.

According to this invention there is provided an input terminal; an output terminal; first and second power supply terminals; a first transistor having a base connected to the input terminal; a second transistor, opposite in conductivity type to the first transistor, having a base connected to the collector of the first transistor, an emitter connected to the first power supply terminal, and a collector connected to the output terminal; means connected between the collector of the second transistor and the emitter of the first transistor to permit a voltage drop; and a current source connected between the emitter of the first transistor and the second power supply terminal.

This invention can be more fully understood from the following detailed description when taken in conjunction with the accompanying drawings, in which:

FIG. 1 shows a voltage follower circuit according to one embodiment of this invention;

FIG. 2 shows a voltage follower circuit using transistors opposite in conductivity type to those in FIG. 1;

FIG. 3 shows a voltage follower circuit according to another embodiments of this invention;

FIG. 4 shows a voltage follower circuit using transistors opposite in conductivity type to those in FIG. 3;

In FIG. 1, a voltage follower circuit comprises a combined transistor circuit including an npn transistor TR1, pnp transistor TR2 and diode-connected npn transitor TR3, and a constant current source circuit including an npn transistors TR4 and TR5, resistor R1 and power supply E. An input terminal $V_1$ is coupled to the base of the transistor TR1. The transistor TR2 has a base connected to the collector of the transistor TR1 and an emitter connected to the positive terminal of the power supply E whose negative terminal is grounded. The transistor TR2 has a collector connected to an output terminal $V_0$ and to the collector of the transistor TR3. The transistor TR3 has a base connected to its own collector and an emitter connected to the emitter of the transistor TR1.

The transistor TR4 has a grounded emitter and a collector connected to a junction between the emitters of the transistors TR1 and TR3. The emitter and base of the transistor TR5 are respectively connected to the emitter and base of the transistor TR4. The transistor TR5 has a collector connected to its own base and to the positive terminal of the power supply E through a resistor R1.

An input signal to the input terminal $V_1$ is amplified by the transistor TR1 and supplied to the base of the transistor TR2 where it is again amplified. An output signal is taken out from the collector of the transistor TR2. Since the collector output of the transistor TR2 is 100% negatively fed back to the emitter of the transistor TR1 by means of the transistor TR3 and constant current source circuit including the transistors TR4 and TR5, the voltage amplification factor of the voltage follower circuit in FIG. 1 is substantially unity and the current amplification factor becomes substantially equal to the product of the current amplification factors of the transistors TR1 and TR2, showing a very great value. In the voltage follower circuit shown in FIG. 1 the output terminal $V_0$ is coupled to the base of the diode-coupled transistor TR3 and the base potential of the transistor TR3 becomes higher than the emitter potential of the transistor TR3. If the base-emitter voltages of the transistor TR1 and TR3 are set to be substantially equal to each other, it is possible to obtain an ouptut voltage substantially equal to the input voltage. If the base-emitter voltage of the transistor TR3 is set to be higher than the base-emitter voltage of the transistor TR1, it is possible to obtain a high output voltage higher than the input voltage.

Figure 6:
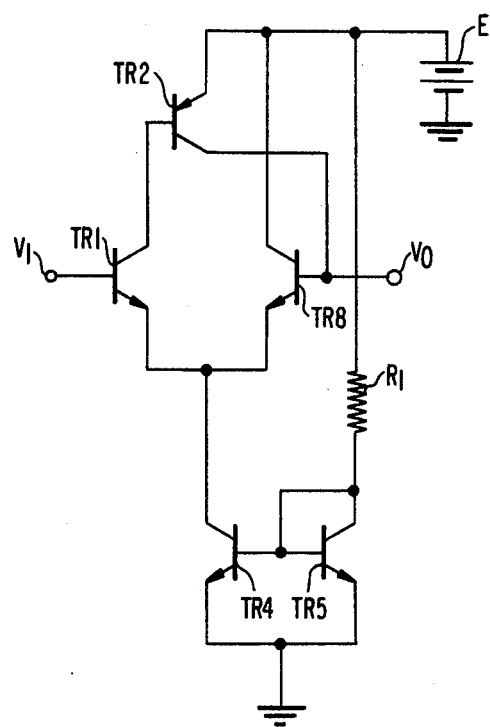
FIG. 6 shows a voltage follower circuit according to another embodiment of this invention.
Figure 7:
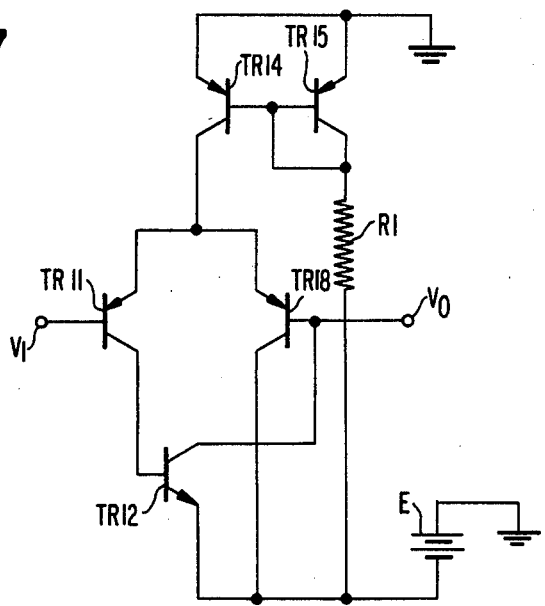
FIG. 7 shows a voltage follower circuit using transistors opposite in conductivity type to those in FIG. 6.

The collector of the transistor TR2 can deliver an output current until the collector-emitter voltage becomes a saturation voltage. The collector-emitter saturation voltage of the transistor TR2 is at low level of about 0.2V and in consequence it is possible to obtain a high output voltage very near the power supply voltage. Although the diode-connected transistor TR3 is short circuited between its base and collector, the same effect can also be obtained if either a transistor connected in a collector-emitter configuration, or a transistor of conductivity type opposite to that of the transistor TR3 or a diode is used in place of the transistor TR3, or collector of transistor TR3 is connected to the power supply E. The latter circuitry is shown in FIG. 6 and FIG. 7. In FIG. 1 the constant current circuit including the transistors TR4 and TR5 and resistor R1 substantially supplies a constant current to the junction between the emitters of the transistors TR1 and TR3. The constant current circuit can be replaced by a resistor having a sufficiently high value and, however, a high power supply voltage is unavoidably required in this case.

FIG. 2 shows a voltage follower circuit comprising transistors TR11 to TR15 opposite in conductivity type to the transistors TR1 to TR5 in the voltage follower circuit in FIG. 1. The voltage follower circuit performs substantially the same operation as that of the voltage follower circuit in FIG. 1 and the same effect as in the voltage follower circuit in FIG. 1 is obtained.

If in the voltage follower circuit shown in FIG. 1 the current amplification factor of the transistor TR2 is high, a sufficiently large current can not be delivered to the transistor TR1, making the operation of the transistor TR1 unstable. If leakage current flows through the transistor TR1, there is a possibility that the transistor TR2 will be saturated due to the leakage current. Where the diode-connected transistor such as the transistor TR3 is used, a sinking current flowing from the output terminal $V_0$ to ground is unavoidably passed through the transistor TR4. Because of the restricted current capacity the output impedance can not be lowered over a wide range. Such a defect can be satisfactorily avoided in the voltage follower circuit according to the second embodiment of this invention.

A voltage follower circuit in FIG. 3 is similar to the voltage follower circuit in FIG. 1 except that a transistor TR6 is used in place of the diode-connected transistor TR3 and that a bias circuit including a transistor TR7 and resistor R2 is connected in parallel with the transistor TR2. The transistor TR6 has an emitter connected to the collector of the transistor TR2, a grounded collector and a base connected to the emitter of the transistor TR1, thus enhancing the output current supply capacity of the voltage follower circuit. The transistor TR7 has a collector connected to the collector of the transistor TR1, an emitter connected through the resistor R2 to the emitter of the transistor TR2, and a base connected to the base of the transistor TR2 and to the collector of the transistor TR7.

A bias current is supplied to the transistor TR1 through the bias circuit including the transistor TR7 and resistor R2, making the operation of the transistor TR1 stable and preventing the saturation of the transistor TR2. Where instead of the transistor TR3 in FIG. 1 use is made of the transistor TR6 of the opposite conductivity type, a sinking current from an output terminal TR3 flows to ground through the collector of the transistor TR6, providing a low output impedance over a wide range. It will be self-evident that the circuit including the transistor TR6 and circuit including the transistor TR7 and resistor R2 show their effects independently of each other. The synergistic action of both the circuits can enhance the function of the voltage follower circuit.

FIG. 4 shows a voltage follower circuit comprising transistors TR11 and TR12 and TR14 to TR17 opposite in conductivity type to the transistors TR1 and TR2 and TR4 to TR7 in the voltage follower circuit in FIG. 3. The voltage follower circuit performs the same operation as that of the voltage follower circuit and the same effect as in the voltage follower circuit in FIG. 3 is obtained.

Figure 5:
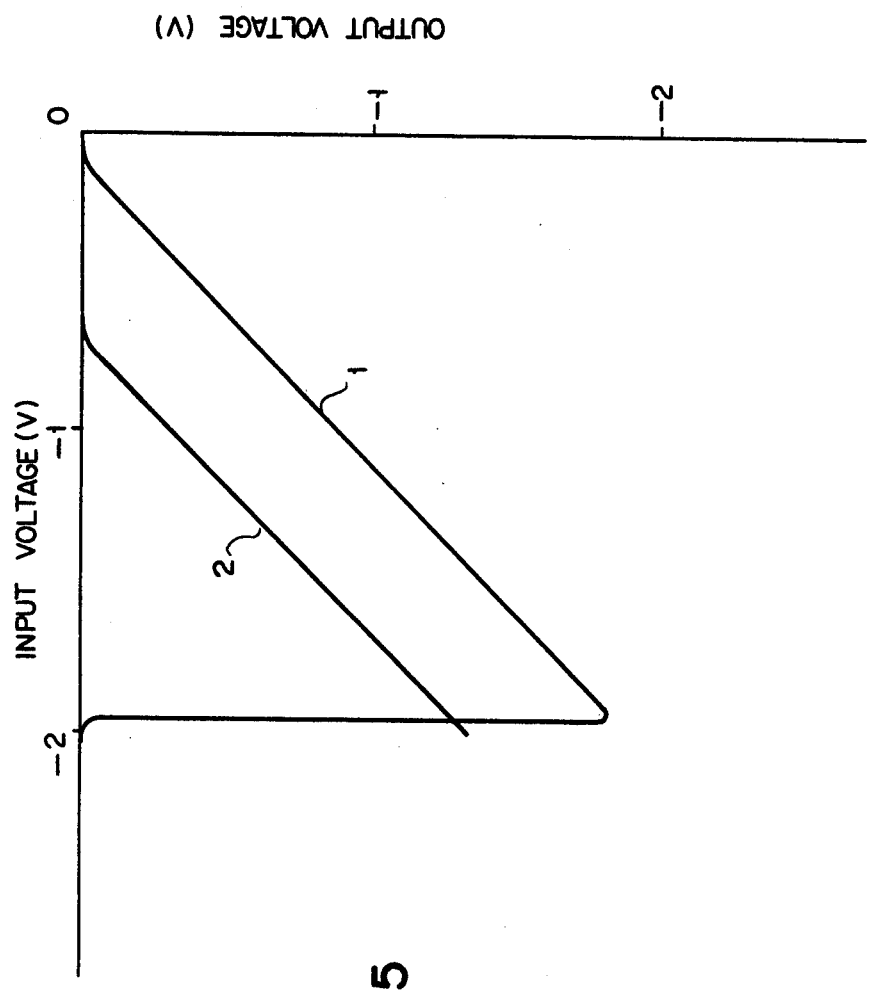
FIG. 5 shows a graph showing input and output characteristics of the votlage follower circuit of FIG. 4 and an ordinary emitter follower circuit.

FIG. 5 shows a comparison in input and output characteristic between the voltage follower circuit in FIG. 4 and an ordinary emitter follower circuit. In FIG. 5 a curve 1 shows the input and output characteristic of the voltage follower circuit in FIG. 4 in which the transistors TR11, TR14 and TR15 correspond to lateral type pnp transistors having a current amplification factor of 3, the transistors TR12, TR16 and TR17 correspond to npn transistors having a current amplification factor of 100, resistors R1 and R2 correspond to 20 kΩ and 4 kΩ resistors respectively, and a load resistor corresponds to a 5 kΩ resistor in parallel with the collector-emitter path of the transistor TR16. The curve 2 shows the input and output characteristic of an ordinary emitter follower circuit having a load resistor of 5 kΩ. In either case, the power supply voltage is 2V.

As will be evident from FIG. 5, for the voltage follower circuit according to this invention an output voltage substantially equal to the input voltage is obtained as in the curve 1. For the ordinary voltage follower circuit, however, the absolute value of the output voltage becomes lower than the absolute value of the input voltage as shown in the curve 1. In consequence, in the voltage follower circuit according to this invention the input and output characteristic is markedly improved.

What is claimed is:

1. A voltage follower circuit comprising:
   an input terminal,
   an output terminal,
   first and second power supply terminals,
   a first transistor of one conductivity type having a base connected to said input terminal,
   a second transistor, opposite in conductivity type to said first transistor, and having a base connected to the collector of said first transistor, an emitter connected to said first power supply terminal, and a collector connected to said output terminal,
   a third transistor, opposite in conductivity type to said first transistor, and having an emitter connected to said output terminal, a base connected to the emitter of said first transistor, and a collector coupled to said second power supply terminal, and
   a current source connected between the emitter of said first transistor and said second power supply terminal.

2. A voltage follower circuit according to claim 1, further comprising:
   a fourth transistor, opposite in conductivity type to said first transistor and having a collector connected to the collector of said first transistor, a base connected to its collector and to the base of said second transistor, and an emitter coupled to the emitter of the second transistor.

3. A voltage follower circuit according to claim 1 further comprising:
   a fourth transistor, opposite in conductivity type to said first transistor, and having a collector connected to the collector of said first transistor, and a base connected to its collector and to the base of said second transistor, and
   a resistor connected between the emitter of said fourth transistor and the emitter of said second transistor, whereby a bias current is supplied to the collector of said first transistor.

4. A voltage follower circuit according to claim 3, in which said first transistor is a pnp transistor.

5. A voltage follower circuit according to claim 3, in which said first transistor is an npn transistor.

6. A voltage follower circuit according to claim 1, wherein said current source comprises:
   a fourth transistor having its collector connected to the emitter of said first transistor,
   a fifth transistor having its base and emitter respectively connected to the base and emitter of said fourth transistor, and a collector connected to its base, and
   a resistor connected between the collector of said fifth transistor and said first power supply terminal, the emitters of the fourth and fifth transistors being connected to said second power supply terminal.

7. A voltage follower circuit comprising:

an input terminal,
an output terminal,
first and second power supply terminals,
a first transistor of one conductivity type having a base connected to said input terminal,
a second transistor, opposite in conductivity type to said first transistor, and having its base connected to the collector of said first transistor, an emitter connected to said first power supply terminal, and a collector connected to said output terminal,
a third transistor of the same conductivity type as said first transistor and having an emitter connected to the emitter of said first transistor, a base connected to said output terminal and a collector connected to said first power supply terminal, and, a current source connected between the emitters of said first and third transistors and said second power supply terminal.

8. A voltage follower circuit according to claim 7, wherein said first transistor is a pnp transistor.

9. A voltage follower circuit according to claim 7, wherein said first transistor is an npn transistor.

10. A voltage follower circuit according to claim 7 wherein said current source comprises:
a fourth transistor having a collector connected to the emitters of said first and third transistors, a fifth transistor having a base and emitter respectively connected to the base and emitter of said fourth transistor, and a collector connected to its base, and
a resistor connected between the collector of said fifth transistor and said first power supply terminal, the emitters of the fourth and fifth transistors being connected to said second power supply terminal.

* * * * *